United States Patent [19]

Kawada

[11] Patent Number: 4,907,002
[45] Date of Patent: Mar. 6, 1990

[54] SUCCESSIVE APPROXIMATION ANALOG TO DIGITAL CONVERTER

[75] Inventor: Shigeru Kawada, Tokyo, Japan
[73] Assignee: NEC Corporation, Tokyo, Japan
[21] Appl. No.: 224,614
[22] Filed: Jul. 27, 1988

[30] Foreign Application Priority Data

Jul. 27, 1987 [JP] Japan .................................. 62-188177

[51] Int. Cl.⁴ .............................................. H03M 1/46
[52] U.S. Cl. .................................. 341/172; 341/122; 341/145; 341/155
[58] Field of Search ............... 341/122, 145, 156, 163, 341/172

[56] References Cited

U.S. PATENT DOCUMENTS

| | | | |
|---|---|---|---|
| 4,350,975 | 9/1982 | Haque et al. | 341/172 |
| 4,381,496 | 4/1983 | Carter | 341/172 |
| 4,385,286 | 5/1983 | Haque | 341/172 |
| 4,415,882 | 11/1983 | Akazawa et al. | 341/156 |
| 4,593,270 | 6/1986 | White | 341/163 |
| 4,647,903 | 3/1987 | Ryu | 341/145 |
| 4,649,371 | 3/1987 | Kolluri | 341/159 |
| 4,764,750 | 8/1988 | Kawada | 341/122 |
| 4,831,381 | 5/1989 | Hester | 341/172 |

OTHER PUBLICATIONS

Electronic Engineer, Dec., 1979, "A One-Chip A/D Converter In MOS", pp. 82-87, M. J. Walsh.
IEEE Journal of Solid-State Circuits, vol., SC-10, No. 6, Dec., 1975 "All-MOS Charge Redistribution Analog-to-Digital Conversion Techniques"-Part 1, pp. 371-385, James L. McCreary & Paul R. Gray.
CH1993-5/84-0000-1202 1984 IEEE, CMOS Analog Cells for General Purposes A/D Conversion in Custom and Semi-Custom Applications, pp. 1202-1206, Jeffrey R. Ireland, Michael B. Terry and David Allstot.

Primary Examiner—William M. Shoop, Jr.
Assistant Examiner—Helen Kim
Attorney, Agent, or Firm—Sughrue, Mion, Zinn, Macpeak & Seas

[57] ABSTRACT

In a successive approximation analog to digital converter, an analog signal to be converted to a digital signal is held in a local digital to analog converter. The analog signal thus held is sampled dependent on the bit order of the digital signal, and the sampled analog signal is subjected to a successive bit comparison in a first comparator. A successive approximation register controls the local digital to analog converter to perform the sampling of the held analog signal, and holds the results of the successive bit comparison to provide the digital signal. Second and third comparators compare the analog signal and two reference signals, so that the successive bit comparison is performed from the MSB to the LSB where a voltage of the analog signal is between voltages of the two reference signals, while the successive bit comparison is performed from the second significant bit to the LSB where the analog signal voltage is outside a range between the voltages.

4 Claims, 4 Drawing Sheets

SUCCESSIVE APPROXIMATION ANALOG TO DIGITAL CONVERTER

The invention relates to a successive approximation analog to digital converter, and more particularly to a successive approximation analog to digital converter in which a local digital to analog converter is composed of a capacitor array of a charge redistribution type.

BACKGROUND OF THE INVENTION

These days, a digitalization of electronic and electric apparatus etc. has been promoted in many fields. In such apparatus, an analog to digital converter (defined as "ADC" hereinafter) and a digital to analog converter (defined as "DAC" hereinafter) are very important to connect means for analog and digital signals with each other.

Among such ADCs, a successive approximation ADC is used advantageously in view of a middle; and high; speed operation and a considerable number of conversion bits.

In the approximation ADC, successive an analog signal is sampled to be held in a sample; and-hold circuit. On the other hand, a first reference voltage $V_R^+$ and a second reference voltage $V_R^-$ are supplied to a local DAC in which a predetermined calculation of the voltages $V_R^+$ and $V_R^-$ is performed in accordance with a bit order of a control digital signal supplied from a successive approximation register thereby producing a new reference potential. The analog signal as held in the sample; and-hold circuit is compared in a comparator with the reference potential of the local DAC to decide a content ("1" or "0") of a bit of a digital signal. Thus, all bits of the digital signal are compared successively with corresponding reference potentials which are calculated based on the bit order of the digital signal. Accordingly, a content of all the bits is decided, and the digital signal thus obtained is supplied from the successive approximation register. A local DAC described above is one of two types depending on its use of either of a resistor string or a capacitor array.

In the successive approximation ADC in which the resistor string is utilized, however, there is a disadvantage that a portion of an area occupied by the resistor string becomes large in a semiconductor integrated circuit because the number of resistors is increased as that of the bits is increased for the reason resistors of at least $2^n$ are required to be provided therein where n is the number of bits. In order to avoid the increase of the resistor area, it is considered that a resistance value of each unit resistor is decreased. However, this results in much deterioration of precision in the analog to digital conversion process because contact resistance values of the connecting points of the unit resistor are fluctuated.

In order to overcome the disadvantage described above, a local DAC of a charge redistribution type is often used in an ADC in which a digital signal having a large number of bits is obtained. In the local DAC, each capacitor of a capacitor array is connected through, for instance, three switches to three input terminals for an analog signal, and first and second reference voltages. Each of the switches is composed of a transfer gate including a pair of N; and P-channel MOS transistors. Even in an ADC utilizing such a local DAC, there is the disadvantage that an error affecting the precision of the analog to digital conversion occurs when signals for turning on the switches are supplied thereto later than respective specified timings. The construction and operation of this ADC utilizing such a local DAC thereof will be described in detail together with causes of the disadvantage hereinbelow.

SUMMARY OF THE INVENTION

Accordingly, it is an object of the invention to provide a successive approximation analog to digital converter in which an analog signal is converted to a digital signal without producing any error.

It is a further object of the invention to provide a successive approximation analog to digital converter in which high precision is obtained in an analog to digital conversion.

It is a still further object of the invention to provide a successive approximation analog to digital converter in which an analog signal is converted to a digital signal without inviting the increase of operation time as compared to a conventional converter.

According to the invention, a successive approximation analog to digital converter comprises:

a local digital to analog converter for sampling an input analog signal held therein prior to a successive bit comparison from the most significant bit to the least significant bit of a digital signal to be obtained, and including a capacitor array composed of plural capacitors, the number of the plural capacitors being dependent on the number of bits of the digital signal, and each of the plural capacitors being connected to a common connecting point and to a switch connected to lines for the input analog signal, and first and second predetermined reference voltages, respectively;

a first comparator for comparing a voltage of the common connecting point of the capacitor array and a middle point voltage between the first and second predetermined voltages to produce content signals of the bits for the digital signal;

a successive approximation register for supplying a control digital signal dependent on the bit order to the local digital to analog converter to turn the switch on a terminal of one line selected from the lines dependent on the bit order, the control digital signal controlling the common connecting point voltage to be changed dependent on the bit order, and for receiving and storing the content signals to provide the digital signal;

second and third comparators for comparing a voltage of the input analog signal and a third predetermined reference voltage and for comparing the voltage of the input analog signal and a fourth predetermined reference voltage, respectively, the third predetermined reference voltage being greater than the fourth predetermined reference voltage, thereby producing a first control signal where the voltage of the input analog signal is between the third and fourth predetermined reference voltages and a second control signal wherein the voltage of the input analog signal is outside a voltage range between the third and fourth predetermined reference voltages; and a control means for controlling the local digital to analog converter and the successive approximation register to conduct the successive bit comparison from the most significant bit to the least significant bit when the first control signal is produced, and to conduct the successive bit comparison from the second significant bit to the least significant bit without a bit comparison of the most significant bit, a content of the most significant bit being determined by a comparison of the voltage of the input analog signal with the third and fourth predetermined reference voltages, when the second control signal is produced.

BRIEF DESCRIPTION OF THE DRAWINGS

The invention will be explained in more detail in conjunction with the appended drawings wherein.

DETAILED DESCRIPTION OF PREFERRED EMBODIMENT

Figure 1:
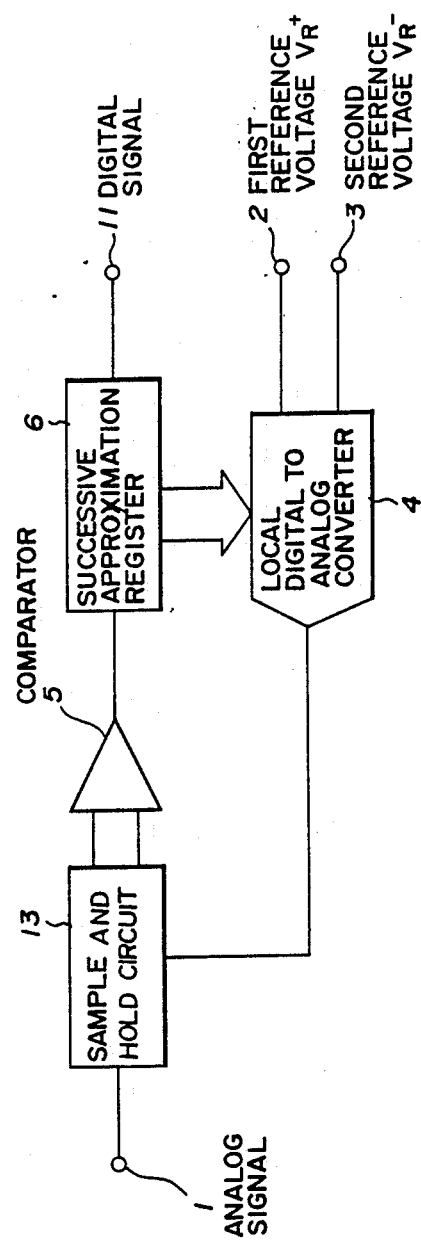
FIG. 1 is a block diagram showing a conventional successive approximation analog to digital converter.

Before describing a successive approximation analog to digital converter in an embodiment according to the invention, a conventional successive approximation analog to digital converter will be explained in FIG. 1. In the ADC, an analog signal supplied to an input terminal 1 is sampled to be held in a sample; and; hold circuit 13. Then, a digital signal having the most significant (MSB) of "1" and remaining bits of "0" is supplied from a successive approximation register 6 to a local DAC 4 in which a calculation of first and second reference voltages $V_R^+$ and $V_R^-$ supplied to input terminal 2 and 3 thereof is performed in accordance with a content "1000 ---- " of the digital signal to produce a middle point potential $(V_R^+ + V_R^-)/2$. The analog signal; which is held in the sample and; hold circuit 13 is compared in a comparator 5 with the middle point potential wherein an output of "1" is supplied from the comparator 5 to the successive approximation register 6 when the analog signal is more than the middle point potential $(V_R^+ + V_R^-)/2$. As a result, the MSB of "1" is held in the successive approximation register 6. An output of "0" is supplied from the comparator 5 to the successive approximation register 6 when the analog signal is less than the middle point potential so that the MSB of "1" is changed to "0". In the former case, a digital signal having the MSB and second significant bit of "1" and remaining bits of "0" is then supplied from the successive approximation register 6 to the local DAC 4 in which a calculation of the first reference voltages $V_R^+$ and the middle point potential $(V_R^+ + V_R^-)/2$ is performed in accordance with a content "1100 ----" of the digital signal to produce a middle point potential of $(3V_R^+ + V_R^-)/4$. In the latter case, on the other hand, a digital signal having the second significant bit of "1" and remaining bits of "0" including the MSB of "0" is supplied from the successive approximation register 6 to the local DAC 4. In DAC 4 a calculation of the second reference voltages $V_R^-$ and the middle point potential "$(V_R^+ + V_R^-)/2$" is performed in accordance with a content "0100 ----" of the digital signal to produce a middle point potential of $(V_R^+ + 3V_R^-)/4$. In the same manner as in the MSB, the analog signal is compared in the comparator 5 with the middle point potential $(3V_R^+ + V_R^-)/4$ in the former case, or $(V_R^+ + 3V_R^-)/4$ in the latter case, and a content of the second significant bit is decided to be "1" or "0" based on an output of the comparator 5. Thus, the above described calculation and comparison are repeated until a content of the least significant bit (LSB) of a digital signal to which the analog signal is converted is decided to be "1" or "0". Finally, the digital signal thus obtained and held in the successive approximation register 6 is supplied through an output terminal 11 thereof to a following stage.

However, there is a disadvantage described above in the conventional ADC in which the local DAC includes a resistor string.

Figure 2:
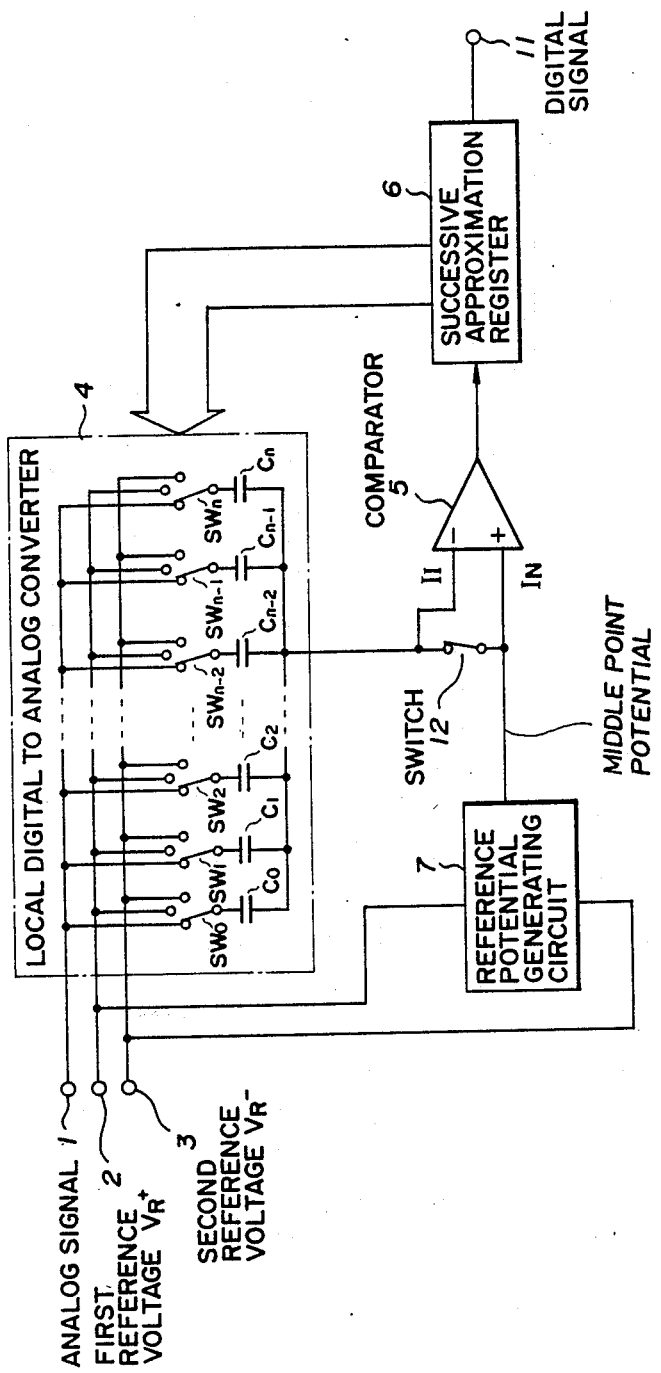
FIG. 2 is a circuit diagram showing a local digital to analog converter using the charge redistribution on a capacitor array in a conventional successive approximation analog to digital converter.

In order to overcome the disadvantage described above, a conventional ADC comprises a local DAC of a charge redistributed type which is shown in FIG. 2. The ADC is of a successive approximation type and comprises a local DAC 4 of a charge redistribution type utilizing a capacitor array and having a function of a sample; and; hold circuit, a comparator 5, a successive approximation register 6, and a reference potential generating circuit 7 wherein a digital signal of n bits is obtained where n is an integer. For the simplification of explanation, it is assumed that n is four. Therefore, capacitors $C_0$ and $C_1$ are $C/8$, $C_2$ is $C/4$, $C_3$ is $C/2$, and $C_4$ is C in the local DAC 4 in a case where a unit capacitance is C.

In the ADC, first of all, switches $SW_0$, $SW_1$, $SW_2$, $SW_3$, and $SW_4$ are all turned on an analog signal input terminal 1, and a switch 12 is also turned on so that a common terminal of the capacitors $C_0$ through $C_4$ for a capacitor array is connected through the switch 12 to a line for a middle point potential "$(V_R^+ + V_R^-)/2$" of the reference potential generating circuit 7 where $V_R^+$ and $V_R^-$ are first and second reference voltages applied to input terminals 2 and 3. If it is assumed that a voltage of the input analog signal is $V_{IN}$, and the charges of the capacitors $C_0$, $C_1$, $C_2$, $C_3$, and $C_4$ are $Q_0$, $Q_1$, $Q_2$, $Q_3$, and $Q_4$, a total charge $Q_T$ charged in the capacitors $C_0$ to $C_4$ is obtained in a following equation (1).

$$\begin{aligned}
Q_0 &= \{V_{IN} - (V_R^+ + V_R^-)/2\}C_0 \\
&= \{V_{IN} - (V_R^+ + V_R^-)/2\} \cdot C/8 \\
\\
Q_1 &= \{V_{IN} - (V_R^+ + V_R^-)/2\}C_1 \\
&= \{V_{IN} - (V_R^+ + V_R^-)/2\} \cdot C/8 \\
\\
Q_2 &= \{V_{IN} - (V_R^+ + V_R^-)/2\}C_2 \\
&= \{V_{IN} - (V_R^+ + V_R^-)/2\} \cdot C/4 \\
\\
Q_3 &= \{V_{IN} - (V_R^+ + V_R^-)/2\}C_3 \\
&= \{V_{IN} - (V_R^+ + V_R^-)/2\} \cdot C/2 \\
\\
Q_4 &= \{V_{IN} - (V_R^+ + V_R^-)/2\}C_4 \\
&= \{V_{IN} - (V_R^+ + V_R^-)/2\} \cdot C \\
\\
Q_T &= Q_0 + Q_1 + Q_2 + Q_3 + Q_4 \\
&= \{V_{IN} - (V_R^+ + V_R^-)/2\} \cdot \\
&\quad (C/8 + C/8 + C/4 + C/2 + C) \\
&= \{V_{IN} - (V_R^+ + V_R^-)/2\} \cdot 2C
\end{aligned} \quad (1)$$

Next, the switch 12 is turned off so that an analog signal is held in the local DAC 4. Then, the switches $SW_0$ through $SW_4$ are controlled so as to be changed over in accordance with the digital signals of the successive approximation register 6 wherein a successive comparison operation is performed.

When the MSB of a digital signal is decided to be "1" or "0", an output of the successive approximation register 6 is "1000", the switch $SW_4$ is turned on the input terminal 2 to which the reference voltage $V_R^+$ is applied, and the switches $SW_0$ through $SW_3$ are turned on by the input terminal 3 to which the reference voltage $V_R^-$ is applied. Here, if it is assumed that a potential of an inverted input $I_I$ and that of a non-inverted input $I_N$ are $V_I$ and $V_N$ in the comparator 5, the following relations are obtained in equations (2) and (3).

$$V_N = (V_R^+ + V_R^-)/2 \qquad (2)$$

$$Q_0 = (V_R^- - V_I) \cdot C/8$$

$$Q_1 = (V_R^- - V_I) \cdot C/8$$

$$Q_2 = (V_R^- - V_I) \cdot C/4$$

$$Q_3 = (V_R^- - V_I) \cdot C/2$$

$$Q_4 = (V_R^+ - V_I) \cdot C$$

$$\begin{aligned} Q_T &= (V_R^- - V_I) \cdot (C/8 + C/8 + C/4 + C/2) + \\ & \quad (V_R^+ - V_I) \cdot C \\ &= (V_R^- - V_I) \cdot C + (V_R^+ V_I) \cdot C \\ &= \{(V_R^+ + V_R^-)/2 - V_I\} \cdot 2C \end{aligned} \qquad (3)$$

In accordance with the law of charge preservation in equations (1) and (3), the potential $V_I$ of the inverted input $I_I$ of the comparator 5 is obtained in equation (4).

$$V_I = (V_R^+ + V_R^-) - V_{IN} \qquad (4)$$

Accordingly, potentials $V_N$ and $V_I$ of the equations (2) and (4) are compared in the comparator 5 in which the potential $V_I$ is less than the potential $V_N$ when the analog signal input voltage $V_{IN}$ is more than a middle point potential $(V_R^+ + V_R^-)/2$ so that an output of "1" is supplied from the comparator 5 to the successive approximation register 6. Alternatively, the potential $V_I$ is more than the potential $V_N$ in a case where the analog signal input voltage $V_{IN}$ is less than the middle point potential $(V_R^+ + V_R^-)/2$ so that the output of the comparator 5 is "0". In this manner, the MSB is decided to be "1" or "0", and thereafter a successive comparison for the second significant bit is commenced. If it is assumed that the MSB is decided to be "1" in the above comparison, a digital signal "1100" is supplied from the successive approximation register 6 to the local DAC 4 in which the switches $SW_4$ and $SW_3$ are turned on the terminal 2 of the first reference voltage $V_R^+$, and the switches $SW_2$, $SW_1$, and $SW_0$ are turned on the terminal 3 of the second reference voltage $V_R^-$. As a result, a following equation (5) is obtained.

$$Q_0 = (V_R^- - V_I) \cdot C/8$$

$$Q_1 = (V_R^- - V_I) \cdot C/8$$

$$Q_2 = (V_R^- - V_I) \cdot C/4$$

$$Q_3 = (V_R^+ V_I) \cdot C/2$$

$$Q_4 = (V_R^+ - V_I) \cdot C$$

$$\begin{aligned} Q_T &= (V_R^- - V_I) \cdot (C/8 + C/8 + C/4) + \\ & \quad (V_R^+ - V_I)(C/2 + C) \\ &= (V_R^- - V_I) \cdot C/2 + (V_R^+ - V_I) \cdot 3C/2 \\ &= \{(3V_R^+ + V_R^-)/4 - V_I\} \cdot 2C \end{aligned} \qquad (5)$$

In accordance with the law of charge preservation in equations (1) and (5), the potential $V_I$ of the inverted input $I_I$ of the comparator 5 is obtained in equation (6) below.

$$V_I = (5V_R^+ + 3V_R^-)/4 - V_{IN} \qquad (6)$$

Accordingly, the second significant bit is decided to be "1" or "0" dependent on which is greater between $(3V_R^+ + V_R^-)/4$ and $V_{IN}$.

Thereafter, a content of the third significant bit to the LSB is decided to be "1" or "0" in the same manner as in the MSB and the second significant bit, although middle point potentials are calculated successively so as to be changed.

In the conventional ADC in which the local DAC including complementary MOS field effect transistors is adopted, however, there is a below-described disadvantage.

A timing at which a group of the switches $SW_0$ through $SW_n$ are turned on the terminals 2 and 3 to which the first and second reference voltages $V_R^+$ and $V_R^-$ are applied is considered in the local DAC 4. The switches $SW_0$ through $SW_n$ of the local DAC 4 are controlled to be turned on and off in accordance with a digital signal supplied from the successive approximation register 6 wherein the digital signal is decoded in a decoder (not shown) positioned between the successive approximation register 6 and the local DAC 4 thereafter being applied to the local DAC 4. In the practical circumstance, therefore, the switches $SW_0$ through $SW_n$ are not turned on and off exactly at a simultaneous timing, but with respective delayed times due to the delay of the control signals.

Figure 3:
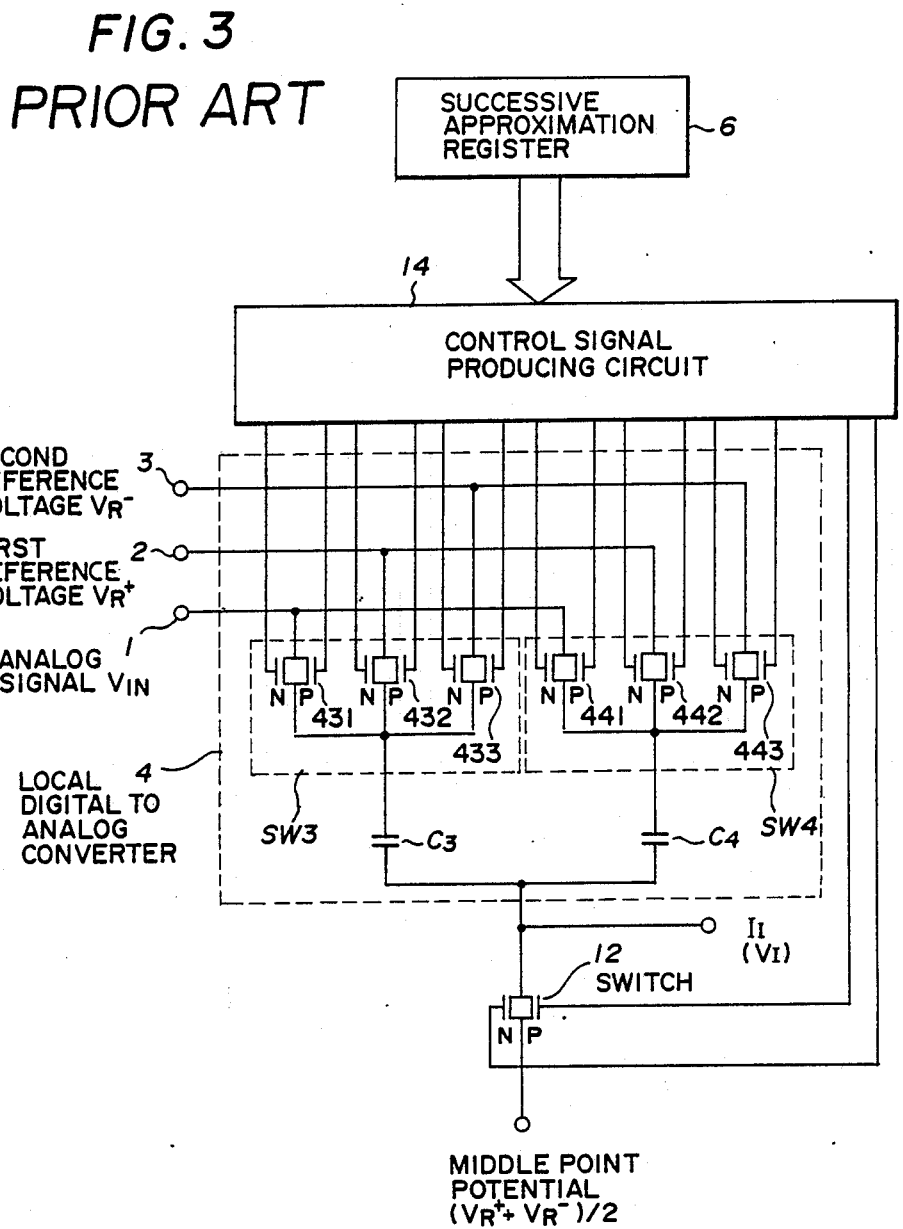
FIG. 3 is a circuit diagram showing a local digital to analog converter using the charge redistribution on a capacitor array utilizing switches of complementary MOS field effect transistors in a conventional successive approximation analog to digital converter.

In FIG. 3, there is shown a substantial portion of the ADC from which a four; bit digital signal is obtained and which comprises the local DAC 4 including the switches $SW_4$ and $SW_3$ ($SW_0$ through $SW_2$ not shown), and a control signal producing circuit 14 for controlling the switches $SW_4$ and $SW_3$ to be turned on and off by decoding a digital signal supplied from the successive approximation register 6. The switches $SW_4$ and $SW_3$ include transfer gates 441, 442, and 443, and transfer gates 431, 432, and 433, respectively, wherein each of the transfer gates includes a pair of N; and P-channel MOS transistors. Here, it is assumed that the first reference voltage $V_R^+$ is 5[V], and the second reference voltage $V_R^-$ is 0[V]. When the voltage values of 5[V] and 0[V] are substituted for the aforementioned equations, a total charge $Q_{TS}$ of a sampling time, and a total charge $Q_{TM}$ of a MSB comparison time, are given in equations (7) and (8).

$$Q_{TS} = (V_{IN} - 2.5) \cdot 2C \qquad (7)$$

$$Q_{TM} = (2.5 - V_I) \cdot 2C \qquad (8)$$

The potential $V_I$ of the MSB comparison time is obtained in equation (4) as follows:

$$V_I = 5 - V_{IN} \quad (9)$$

As apparent from the equation (9), the potential $V_I$ is 0[V] when input analog signal $V_{IN}$ is 5[V], while the potential $V_I$ is 5[V] when the input analog signal $V_{IN}$ is 0[V]. When the input analog signal is sampled in the local DAC 4, the N-and P-MOS transistor pair of the transfer gate 431 of the switch SW$_3$, the N and P-MOS transistor pair of the transfer gate 441 of the switch SW$_4$, and the N-and P-MOS transistor pair of the switch 12 are turned on respectively. If it is assumed that the input analog signal $V_{IN}$ is 5[V], $$Q_3 = (5 - 2.5) \cdot C/2 = 2.5 \cdot C/2 \quad (10)$$

$$Q_4 = (5 - 2.5) \cdot C = 2.5 \cdot C \quad (11)$$

Next, the switch 12 and the transfer gates 431 and 441 are turned off so that a comparison operation of the MSB is commenced wherein the MOS transistor pair of the transfer gate 442 of the switch SW$_4$ and the transistor pair of the transfer gate 433 of the switch SW$_3$ are turned on respectively so that the capacitor C$_4$ is connected to the terminal 2 to which the first reference voltage $V_R^+$ is applied, while the capacitor C$_3$ is connected to the terminal 3 to which the second reference voltage $V_R^-$ is applied. Here, it is assumed that the aforementioned delayed outputs of the control signals occur so that, if the transfer gate 433 is turned on earlier than the transfer gate 442, a terminal of the capacitor C$_4$, on the side of which the switch SW$_4$ is positioned, is in an open state, while a terminal of the capacitor C$_3$, on the side of which the switch SW$_3$ is positioned, is 0[V] of the second reference voltage $V_R^-$. Further, the terminal I$_I$ which is a common connecting point of the capacitor array is under a high impedance state so that the potential of the terminal I$_I$ is decreased down to $-2.5$[V] due to charges of the capacitor C$_3$. As a result the, N-diffusion region is decreased down to $-2.5$[V] in the N-MOS transistor of the switch 12 connected to the common connecting terminal of the capacitor array so that the charges of the capacitor C$_3$ are transferred through a forward-biased N-and P-regions because the N-region is $-2.5$[V] in regard to a P-substrate on which the N-MOS transistor is fabricated, and the P-region is 0[V] in regard to the P-substrate. Therefore, the potential $V_I$ of the common connecting terminal I$_I$ of the capacitor array will be different from a theoretical value of 0[V] because a charge amount of the capacitor C$_3$ is changed already even if the terminal of the capacitor C$_4$, on the side of which the switch SW$_4$ is positioned, is 5[V] of the first reference voltage $V_R^+$ when the transfer gate 442 is turned on with a delayed time due to the delay of a control signal from the control signal producing circuit 14. For this reason, a considerable error occurs so as to result in an imprecise analog to digital conversion.

On the contrary, in a case where the transfer gate 442 is only turned on because it is turned on earlier than the transfer gate 433 due to the delay of control signals, the potential $V_I$ of the common connecting terminal I$_I$ of the capacitor array is 7.5[V] when the input analog signal $V_{IN}$ is 0[V]. At the same time, the P-diffusion region of the P-MOS transistor of the switch 12 is 7.5[V] to form a forward-bias in regard to the N-substrate of 5[V], so that charges of the capacitor C$_4$ are transferred through the forward-biased regions therefrom. Therefore, a considerable error occurs so as to result in the aforementioned disadvantage. In the above explanation, although the input analog signal is 5[V] or 0[V], the same error occurs in the conventional ADC when the input analog signal is within a range of a potential of the common connecting point for the capacitor array in which a connection of N and P-regions is forward-biased.

Figure 4:
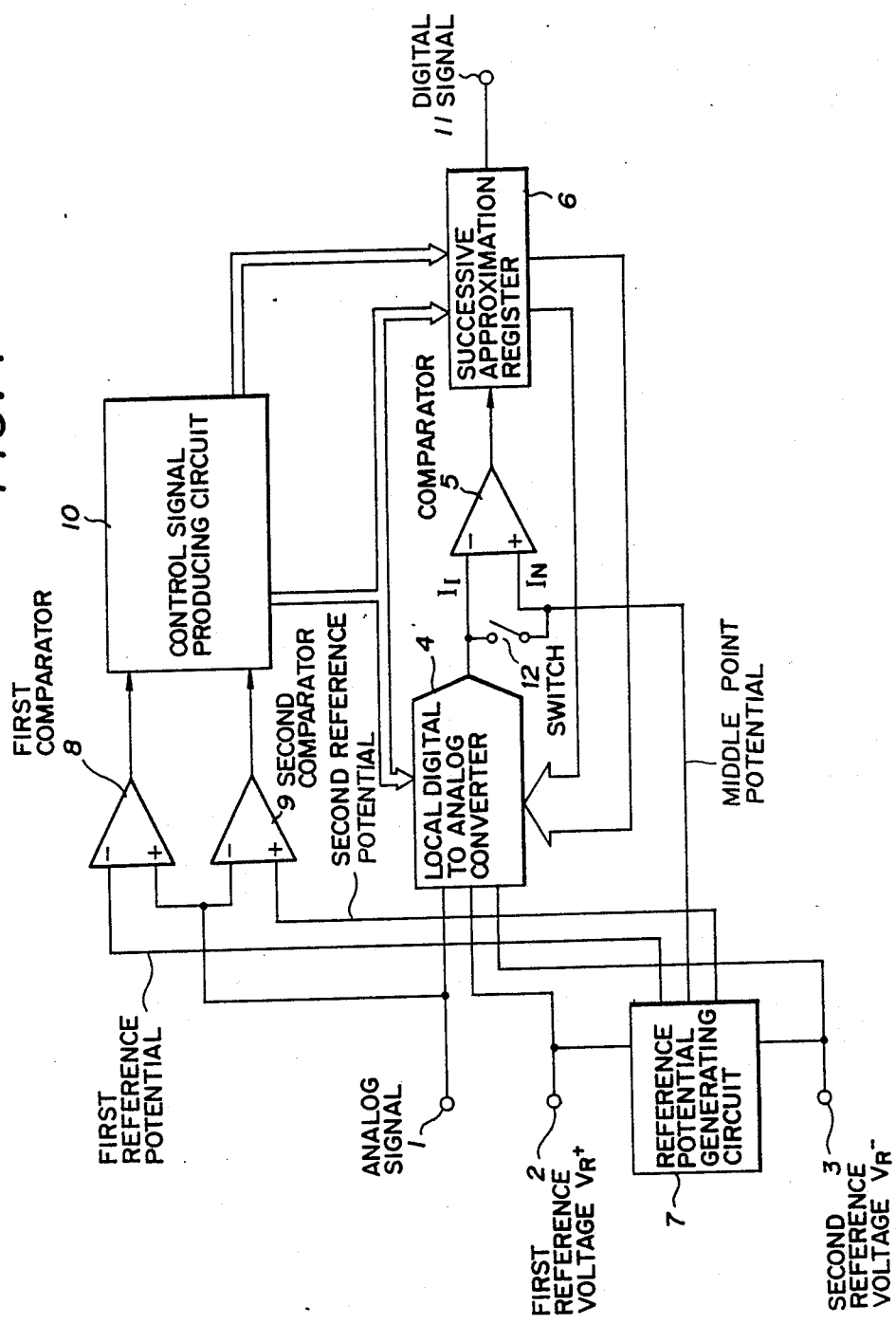
FIG. 4 is a block diagram showing a successive approximation analog to digital converter in an embodiment according to the invention.

In order to overcome the disadvantage, a successive approximation ADC according to the invention is proposed. FIG. 4 shows the successive approximation ADC which comprises an input terminal 1 to which an analog signal is supplied, a terminal 2 to which a first reference voltage $V_R^+$ is applied, a terminal 3 to which a second reference terminal $V_R^-$ is applied, a local DAC 4, a comparator 5, a successive approximation register 6, a reference potential generating circuit 7, a first comparator 8 for comparing levels of a first reference potential supplied from the reference potential generating circuit 7 and of the analog signal, a second comparator 9 for comparing levels of a second reference potential supplied from the reference potential generating circuit 7 and of the analog signal, a control signal producing circuit 10 for controlling a successive comparison operation in accordance with outputs of the first and second comparators 8 and 9, an output terminal 11 from which a digital signal is supplied to a following stage, and a switch 12 positioned between two inputs of the comparator 5, wherein the local DAC 4, the comparator 5, the successive approximation register 6, and the switch 12 are exactly the same as those explained in FIGS. 2 and 3.

In operation, it is assumed that a power source $V_{DD}$ for a semiconductor integrated circuit by which the ADC of the invention is fabricated is more than a power source $V_{SS}$ ($V_{DD} > V_{SS}$), the first and second reference voltages are $V_R^+$ and $V_R^-$ (provided that $V_R^+$ is more than $V_R^-$), a middle point potential supplied from the reference potential generating circuit 7 is $(V_R^+ + V_R^-)/2$, the first reference potential is $(V_R^+ + V_R^-)/2 + \alpha$ (provided that $\alpha$ is more than zero), the second reference potential is $(V_R^+ + V_R^-)/2 - \beta$ (provided that $\beta$ is more than zero), the input analog signal is $V_{IN}$, and potentials of the non-inverted and inverted inputs of the comparator 5 are $V_N$ and $V_I$. Further, it is assumed that capacitors C$_0$ through C$_n$ for a capacitor array are specified in that the capacitor C$_0$ is $C/2^{n-1}$, C$_1$ is $C/2^{n-1}$, -----, C$_i$ is $C/2^{n-i}$, -----C$_{n-1}$ is $C/2$, and C$_n$ is C where C is a unit capacitance, n is the number of bits for a digital signal, and i is one of 1,2 -----, and n.

The switch 12 is turned on, and a group of the switches SW$_0$ through SW$_n$ are all turned on the analog signal input terminal 1 so that the capacitors C$_0$ through C$_n$ are charged between the analog signal potential $V_{IN}$ and the middle point potential $(V_R^+ + V_R^-)/2$ thereby sampling the input analog signal to be held in the local DAC 4. Next, the switch 12 and the switches SW$_0$ through SW$_n$ are all turned off, and the input analog signal $V_{IN}$ and the first reference potential $(V_R^+ + V_R^-)/2 + \alpha$ are compared in the first comparator 8, while the input analog signal $V_{IN}$ and the second reference potential $(V_R^+ + V_R^-)/2 - \beta$ are compared in the second comparator 9.

(A) In these comparisons, both of the first and second comparators 8 and 9 provide outputs of "0" when the input analog signal $V_{IN}$ meets a relation defined in equation (12), whereby $$(V_R^+ + V_R^-)/2 - \beta < V_{IN} < (V_R^+ + V_R^-)/2 + \alpha \quad (12).$$

The outputs are supplied to the control signal producing circuit 10 in which a successive comparison operation is commenced. That is, only the capacitor $C_n$ having a capacitance equal to a half of a total capacitance value of the capacitors $C_0$ through $C_n$ for the capacitor array is connected through the switch $SW_n$ to the terminal 2 to which the first reference voltage $V_R^+$ is applied, while the remaining capacitors $C_0$ through $C_{n-1}$ are connected through the switches $SW_0$ through $SW_{n-1}$ to the terminal 3 to which the second reference voltage $V_R^-$ is applied wherein a comparison operation for the MSB which corresponds to a comparison between the input analog signal $V_{IN}$ and the middle point potential $(V_R^+ + V_R^-)/2$ is conducted. Thereafter, such a comparison is continued successively until the comparison for the LSB is finished thereby converting the input analog signal to a digital signal for n-bits.

(B) In a case where the input analog signal $V_{IN}$ meets a relation of equation (13), whereby $$V_R^- \leq V_{IN} \leq (V_R^+ + V_R^-)/2 - \beta \quad (13)$$

and an output of the first comparator 8 is "0", and that of the second comparator 9 is "1". These outputs are supplied to the control signal producing circuit 10 from which a control signal "0", being regarded as a comparison result of the MSB, is supplied to the successive approximation register 6 in place of an output of the comparator 5 during a period predetermined for the MSB comparison. Control signals are supplied to the local DAC 4 during that period such that the capacitors $C_0$ through $C_{n-1}$ are connected through the switches $SW_0$ through $SW_{n-1}$ to the terminal 3 for the second reference voltage $V_R^-$ as specified to be connected to the second reference voltage $V_R^-$ during the MSB comparison. Meanwhile, the capacitor $C_n$ is not connected to any terminals because the switch $SW_n$ is turned off. Next, a comparison of the second significant bit is commenced wherein the above-described same operation as in the conventional ADC is restored regardless of outputs of the first and second comparators 8 and 9. Namely, the capacitors $C_0$ to $C_{n-2}$ are connected to the terminal 3 for the second reference voltage $V_R^-$, and the capacitor $C_n$ is connected to the terminal 3 for the second reference voltage $V_R^-$ in accordance with the turning-on of the switch $SW_n$. Meanwhile, the capacitor $C_{n-1}$ is changed to be turned on from the terminal 3 for the second reference voltage $V_R^-$ to the terminal 2 for the first reference voltage $V_R^+$ so that a comparison operation for the second significant bit, which corresponds to a comparison between the input analog signal $V_{IN}$ and the middle point potential $(V_R^+ + 3V_R^-)/4$ is performed. An output of the comparator 5 is supplied then to the successive approximation register 6 as a comparison result of the second significant bit. Thereafter, a comparison operation for the third significant bit to the LSB is performed successively so that a digital signal of n bits are supplied from the output terminal to a following stage.

(C) In a case where the input analog signal $V_{IN}$ meets a relation defined by equation (14), whereby $$(V_R^+ + V_R^-)/2 + \alpha \leq V_{IN} \leq V_R^+ \quad (14)$$

an output of the first comparator 8 is "1", and an output of the second comparator 9 is "0". These outputs are supplied to the control signal producing circuit 10 from which a control signal "1" being regarded as a comparison result of the MSB is supplied to the successive approximation register 6 in place of an output of the comparator 5 during a period predetermined for the MSB comparison. Control signals also are supplied to the local DAC 4 during that period such that the capacitor $C_n$, which is connected to the terminal 2 for the first reference voltage $V_R^+$ during the MSB comparison, is connected through the turned-on switch $SW_n$ to the reference voltage $V_R^+$, and the capacitors $C_0$ through $C_{n-1}$ are not connected to any terminals. Next, a comparison operation for the second significant bit is commenced wherein the same operation as in the above-described conventional ADC is restored regardless of outputs of the first and second comparators 8 and 9. In other words, the capacitor $C_n$ is still connected to the terminal 2 for the first reference voltage $V_R^+$, and the capacitor $C_{n-1}$ is changed to be connected through the switch $SW_{n-1}$ to the terminal 2 for the first reference voltage $V_R^+$. Meanwhile the capacitors $C_0$ through $C_{n-2}$ are connected through the switches $SW_0$ through $SW_{n-2}$ to the terminal 3 for the second reference voltage $V_R^-$ wherein a comparison operation for the second significant bit which is a comparison between the input analog signal $V_{IN}$ and the middle point potential $(3V_R^+ + V_R^-)/4$, is performed in the comparator 5. An output of the comparator 5 is supplied to the successive approximation register 6 as a comparison result of the second significant bit. Such a comparison operation is performed successively from the third significant bit to the LSB thereby supplying a digital signal of n bits from the output terminal 11 to a following stage.

The above described operation including a transfer of charges will be further explained on the assumption that the number n of bits is four.

A total charge $Q_T$ is obtained in the aforementioned equation (1) during a period of sampling the input analog signal to be held in the local DAC 4, whereby $$Q_T = \{V_{IN} - (V_R^+ + V_R^-)/2\} \cdot 2C \quad (1).$$

(A) In a case where the input analog signal $V_{IN}$ meets the relation of the aforementioned equation (12), whereby $$(V_R^+ + V_R^-)/2 - \beta < V_{IN} < (V_R^+ + V_R^-)/2 + \alpha \quad (12),$$

a potential $V_I$ of the common connecting terminal $I_I$ for the capacitor array $C_0$ through $C_4$ meets an equation (15) at a time of the MSB comparison temporarily, if the capacitor $C_4$ is connected to the terminal 2 for the first reference voltage $V_R^+$ before the capacitors $C_0$ through $C_3$ are connected to the terminal 3 for the second reference voltage $V_R^-$, whereby $$V_I = (V_R^+ + V_R^-)/2 + (V_R - V_{IN}) \quad (15).$$

An equation (16) is obtained in accordance with the equations (12) and (15), whereby $$V_R^+ - \alpha < V_I < V_R^+ + \beta \quad (16).$$

On the contrary, the potential $V_I$ meets an equation (17) temporarily, if the capacitors $C_0$ through $C_3$ are connected to the terminal 3 for the second reference voltage $V_R^-$ before the capacitor $C_4$ is connected to the terminal 2 for the first reference voltage $V_R^+$, whereby $$V_I = (V_R^+ + V_R^-)/2(V_R^- - V_{IN}) \quad (17).$$

An equation (18) is obtained in accordance with the equations (12) and (17), whereby $$V_R^- - \alpha < V_I < V_R^- + \beta \quad (18).$$

Here, if it is assumed that a forward-biased threshold voltage of a P-N junction is $\gamma$ (provided that $\gamma$ is more than zero), a transfer of charges as observed in the conventional ADC does not occur, and no error is induced in an analog to digital conversion in a case where the threshold voltage $\gamma$ meets equations (19) and (20), whereby $$V_R^+ + \beta < V_{DD} + \gamma \quad (19), \text{ and}$$

$$V_{SS} - \gamma < V_R^- - \alpha \quad (20).$$

Even if the first and second reference voltages $V_R^+$ and $V_R^-$ meet equations (21) and (22) to the maximum values, whereby $$V_R^+ = V_{DD} \quad (21), \text{ and}$$

$$V_R^- = V_{SS} \quad (22),$$

no error is induced in an analog to digital conversion in a case where $\alpha$ and $\beta$ are set to meet equation (23), whereby $$\alpha, \beta < \gamma \quad (23).$$

(B) In a case where the input analog signal $V_I$ meets the aforementioned equation (13), $$V_R^- - V_{IN} \leq (V_R^+ + V_R^-)/2 - \beta \quad (13),$$

only the capacitors $C_0$ through $C_3$ are connected to the terminals 3 for the second reference voltage $V_R^-$ during a period of the MSB comparison so that equation (24) is obtained, whereby $$V_I = (V_R^+ + V_R^-)/2 + (V_R^- - V_{IN}) \quad (24).$$

In accordance with the equations (13) and (24), equation (25) is obtained, whereby $$V_R^- + \beta \leq V_I < (V_R^+ + V_R^-)/2 \quad (25)$$

In this case, no transfer of charges is occured because the threshold value $\gamma$ meets equation (26), whereby $$V_{ss} - \gamma < V_R^- + \beta \quad (26).$$

In this case, there is no problem because equation (22) is met, whereby $$V_R^- = V_{SS} \quad (22),$$

During the second significant bit comparison, the capacitors $C_0$ through $C_2$ are connected still to the terminal 3 for the second reference voltage $V_R^-$, and the capacitor $C_4$ is connected to the terminal 3 for the second reference voltage $V_R^-$, while the capacitor $C_3$ is connected to the terminal 2 for the first reference voltage $V_R^+$.

Therefore, even if the capacitor $C_3$ of C/2 is connected to the terminal 2 for the first reference voltage $V_R^+$ before the capacitor $C_4$ of C is connected to the terminal 3 for the second reference voltage $V_R^-$, where C is a unit capacitance, the input analog signal $V_I$ meets equation (27) because the capacitors $C_0$ through $C_2$ of C/2 which is a total value of C/8, C/8, and C/4 are connected already to the terminal for the second reference voltage $V_R^-$, whereby $$\begin{aligned}V_I &= (V_R^+ + V_R^-)/2 + (V_R^- - V_{IN})/2 \\ &\quad + (V_R^+ - V_{IN})/2 \\ &= (V_R^+ + V_R^-) - V_{IN}\end{aligned} \quad (27)$$

In accordance with equations (13) and (27), an equation (28) is obtained, whereby $$(V_R^+ + V_R^-)/2 + \beta \leq V_I \leq V_R^+ \quad (28).$$

Therefore, no transfer of charges results so that the total charge $Q_T$ is not changed in the capacitor array $C_0$ through $C_4$. On the other hand, even if the capacitor $C_4$ is connected to the terminal 3 for the second reference voltage $V_R^-$ before the capacitor $C_3$ is connected to the terminal 2 for the first reference voltage $V_R^+$, the aforementioned disadvantage does not occur in the conventional ADC as is apparent from the above explanations.

(C) In a case where the input analog signal $V_{IN}$ meets the aforementioned equation (14), $$(V_R^+ + V_R^-)/2 + \alpha \leq V_{IN} \leq V_R^+ \quad (14)$$

the input analog signal $V_{IN}$ is obtained in an equation (29) because the capacitor $C_4$ is connected to the terminal 2 only for the first reference voltage $V_R^+$ during the MSB comparison time, whereby $$V_I = (V_R^+ + V_R^-)/2 + (V_R^+ - V_{IN}) \quad (29).$$

In accordance with the equations (14) and (29), an equation (30) is obtained, whereby $$(V_R^+ + V_R^-)/2 \leq V_I \leq V_R^+ - \alpha \quad (30).$$

In this case, the threshold value $\gamma$ meets an equation (31), whereby $$V_R^+ - \alpha < V_{DD} + \gamma \quad (31).$$

Therefore, no transfer of charges results.
In this case, the equation (21) is met so that no problem occurs in the ADC according to the invention, whereby:

$$V_R^+ = V_{DD} \quad (21).$$

During the second significant bit comparison time, the capacitor $C_4$ is still connected to the terminal 2 for the first reference voltage $V_R^+$, and the capacitor $C_3$ is connected to the terminal 2 for the first reference voltage $V_R^+$, while the capacitors $C_0$ through $C_2$ are connected to the terminal 3 for the second reference voltage $V_R^-$. Therefore, even if the capacitors $C_0$ through $C_2$ are connected to the terminal 3 for the second reference voltage $V_R^-$ before the capacitor $C_3$ is connected to the terminal 2 for the first reference voltage $V_R^+$, the capacitor $C_4$ is connected to the terminal 2 for the first reference voltage $V_R^+$ already so that the input analog signal $V_I$ is obtained in an equation (32), whereby $$V_I = (V_R^+ + V_R^-)/2 + (V_R^+ - V_I) + (V_R^- - V_I)/2$$
$$= (3V_R^+/2 + V_R^-) - 3V_I/2 \quad (32).$$

In accordance with the equations (14) and (32), an equation (33) is obtained, whereby $$V_R^- \leq V_I \leq 3V_R^+/2 + V_R^-/4 - 3\alpha/2 \quad (33).$$

Therefore, the total charge $Q_T$ is not changed at all. On the other hand, even if the capacitor $C_3$ is connected to the terminal 2 for the first reference voltage $V_R^{30}$ before the capacitors $C_0$ through $C_2$ are connected to the terminal 3 for the second reference voltage $V_R^-$, there is no problem as apparent from the above explanations.

Although the invention has been described with respect to a specific embodiment for complete and clear disclosure, the appended claims are not intended to thus limited but are to be construed as embodying all modifications and alternative constructions that may occur to one skilled in the art which fairly fall within the basic teaching herein set forth.

What is claimed is:

1. A successive approximation analog to digital converter, comprising:
    a local digital to analog converter for sampling an input analog signal to be held therein prior to a successive bit comparison from a most significant bit to a least significant bit of a digital signal to be obtained, and including a capacitor array composed of plural capacitors, a number of said plural capacitors being dependent on a number of bits of said digital signal, and each of said plural capacitors being connected to a common connecting point and to a switch connected to lines for said input analog signal, and first and second predetermined reference voltages, respectively;
    a first comparator for comparing a voltage of said common connecting point of said capacitor array and a middle point voltage between said first and second predetermined voltages to produce content signals of said bits for said digital signal;
    a successive approximation register for supplying a control digital signal dependent on said bit order to said local digital to analog converter to turn said switch on a terminal of one line selected from said lines dependent on said bit order, said control digital signal controlling said common connecting point voltage to be changed dependent on said bit order, and for receiving and storing said content signals to provide said digital signal;
    second and third comparators for comparing a voltage of said input analog signal and a third predetermined reference voltage and for comparing said voltage of said input analog signal and a fourth predetermined reference voltage, respectively, said third predetermined reference voltage being greater than said fourth predetermined reference voltage, thereby producing a first control signal where said voltage of said input analog signal is between said third and fourth predetermined reference voltages and a second control signal where said input analog signal is outside a voltage range between said third and fourth predetermined reference voltages; and
    a control means for controlling said local digital to analog converter and said successive approximation register to conduct said successive bit comparison from said most significant bit to said least significant bit when said first control signal is produced, and to conduct said successive bit comparison from a second significant bit to said least significant bit without a bit comparison of said most significant bit, a content of said most significant bit being determined by a comparison of said voltage of said input analog signal with said third and fourth predetermined reference voltages, when said second control signal is produced.

2. A successive approximation analog to digital converter according to claim 1, wherein:
    said middle point voltage is a half value of an added value of said first and second predetermined voltages.

3. A successive approximation analog to digital converter according to claim 2, further comprising:
    a reference voltage generating circuit for generating said third predetermined reference voltage which is greater than a middle point voltage between said first and second predetermined reference voltages, and said fourth predetermined reference voltage which is lower than said middle point voltage.

4. A successive approximation analog to digital converter, comprising:
    a local digital to analog converter receiving an input analog signal to perform a successive bit comparison for converting said received input analog signal to a digital signal;
    first and second comparators for comparing a voltage of said input analog signal and a first predetermined reference voltage, and for comparing said voltage of said input analog signal and a second predetermined reference voltage, respectively, said first predetermined reference voltage being greater than said second predetermined reference voltage, thereby producing a first control signal where said voltage of said input analog signal is between said first and second predetermined reference voltages, and a second control signal where said voltage of said input analog signal is outside a voltage range between said first and second predetermined reference voltages; and
    a control means for controlling said local digital to analog converter to conduct said successive bit comparison on a most significant bit to a least significant bit when said first control signal is produced, and to conduct said successive bit comparison from the second significant bit to said least significant bit without a bit comparison of said most significant bit, a content of said most significant bit being determined by a comparison of said voltage of said input analog signal with said third and fourth predetermined reference voltages, when said second control signal is produced.

* * * * *